(12) United States Patent
Atri et al.

(10) Patent No.: US 7,424,643 B2
(45) Date of Patent: Sep. 9, 2008

(54) DEVICE, SYSTEM AND METHOD FOR POWER LOSS RECOVERY PROCEDURE FOR SOLID STATE NON-VOLATILE MEMORY

(75) Inventors: Sunil Atri, Folsom, CA (US); Nicholas Woo, Albuquerque, NM (US); Kurt Sowa, Shingle Springs, CA (US); Ajith Illendula, Albuquerque, NM (US)

(73) Assignee: Intel Corporation, Santa Clara, CA (US)

( * ) Notice: Subject to any disclaimer, the term of this patent is extended or adjusted under 35 U.S.C. 154(b) by 643 days.

(21) Appl. No.: 11/025,113

(22) Filed: Dec. 30, 2004

(65) Prior Publication Data

US 2006/0146633 A1     Jul. 6, 2006

(51) Int. Cl.
*G06F 11/00*     (2006.01)
(52) U.S. Cl. .................................................. 714/22
(58) Field of Classification Search .................. 714/3, 714/14, 15, 20–22, 24, 2, 31
See application file for complete search history.

(56) References Cited

U.S. PATENT DOCUMENTS

| | | | |
|---|---|---|---|
| 6,170,066 B1* | 1/2001 | See ............................. 714/22 |
| 7,181,672 B2* | 2/2007 | Atri et al. .................... 714/763 |
| 2005/0108491 A1* | 5/2005 | Wong et al. ................. 711/167 |
| 2006/0002197 A1* | 1/2006 | Rudelic ................... 365/189.09 |
| 2006/0059385 A1* | 3/2006 | Atri et al. ..................... 714/14 |

\* cited by examiner

*Primary Examiner*—Nadeem Iqbal
(74) *Attorney, Agent, or Firm*—Pearl Cohen Zedek Latzer, LLP

(57) ABSTRACT

A method, device and system for determining whether a prior shut down of a device having a solid state non-volatile memory unit such as a flash memory unit resulted from a power loss and disorderly shut down and whether a power loss recovery procedure should be run.

18 Claims, 3 Drawing Sheets

DEVICE, SYSTEM AND METHOD FOR POWER LOSS RECOVERY PROCEDURE FOR SOLID STATE NON-VOLATILE MEMORY

BACKGROUND OF THE INVENTION

Devices that include solid state non-volatile memory units such as for example flash memory units may execute power loss recovery (PLR) tests and procedures when such device is turned on or powered up. PLR procedures may account for and remedy possible corruption to a memory unit that may have resulted from an unplanned, accidental or disorderly loss of power in the device or memory. A PLR may, for example and among other actions, determine whether a solid state non-volatile memory unit such as a flash memory unit was partially modified at the time of a power loss in a device, possibly resulting in corrupted data in the flash memory of such device. PLR procedures may be time consuming to run, and may delay the availability of a device for use after it has been turned on. Furthermore, unanticipated losses of power may be rare, and running a PLR procedure each time a device is turned on may be unnecessary.

BRIEF DESCRIPTION OF THE DRAWINGS

Embodiments of the invention will be understood and appreciated more fully from the following detailed description taken in conjunction with the drawings in which.

DETAILED DESCRIPTION OF THE INVENTION

In the following description, various aspects of the present invention will be described. For purposes of explanation, specific configurations and details are set forth in order to provide a thorough understanding of the present invention. However, it will also be apparent to one skilled in the art that the present invention may be practiced without the specific details presented herein. Furthermore, well-known features may be omitted or simplified in order not to obscure the present invention. Various examples are given throughout this description. These are merely descriptions of specific embodiments of the invention. The scope of the invention is not limited to the examples given.

Unless specifically stated otherwise, as apparent from the following discussions, it is appreciated that throughout the specification, discussions utilizing terms such as "processing," "computing," "calculating," "determining," or the like, refer to the action and/or processes of a processor, computer or computing system, or similar electronic or hardware computing device, that manipulates and/or transforms data represented as physical, such as electronic quantities within the computing system's registers and/or memories into other data similarly represented as physical quantities within the computing system's memories, registers or other such information storage, transmission or display devices.

The processes and displays presented herein are not inherently related to any particular computer, communication device or other apparatus. The desired structure for a variety of these systems will appear from the description below. In addition, embodiments of the present invention are not described with reference to any particular programming language, machine code, etc. It will be appreciated that a variety of programming languages, machine codes, etc. may be used to implement the teachings of the invention as described herein. Embodiments of the invention may be included on a medium or article such as a hard disc, disc on key or other memory unit having stored thereon machine-accessible instructions that when executed result in or implement an embodiment of the invention.

Figure 1:
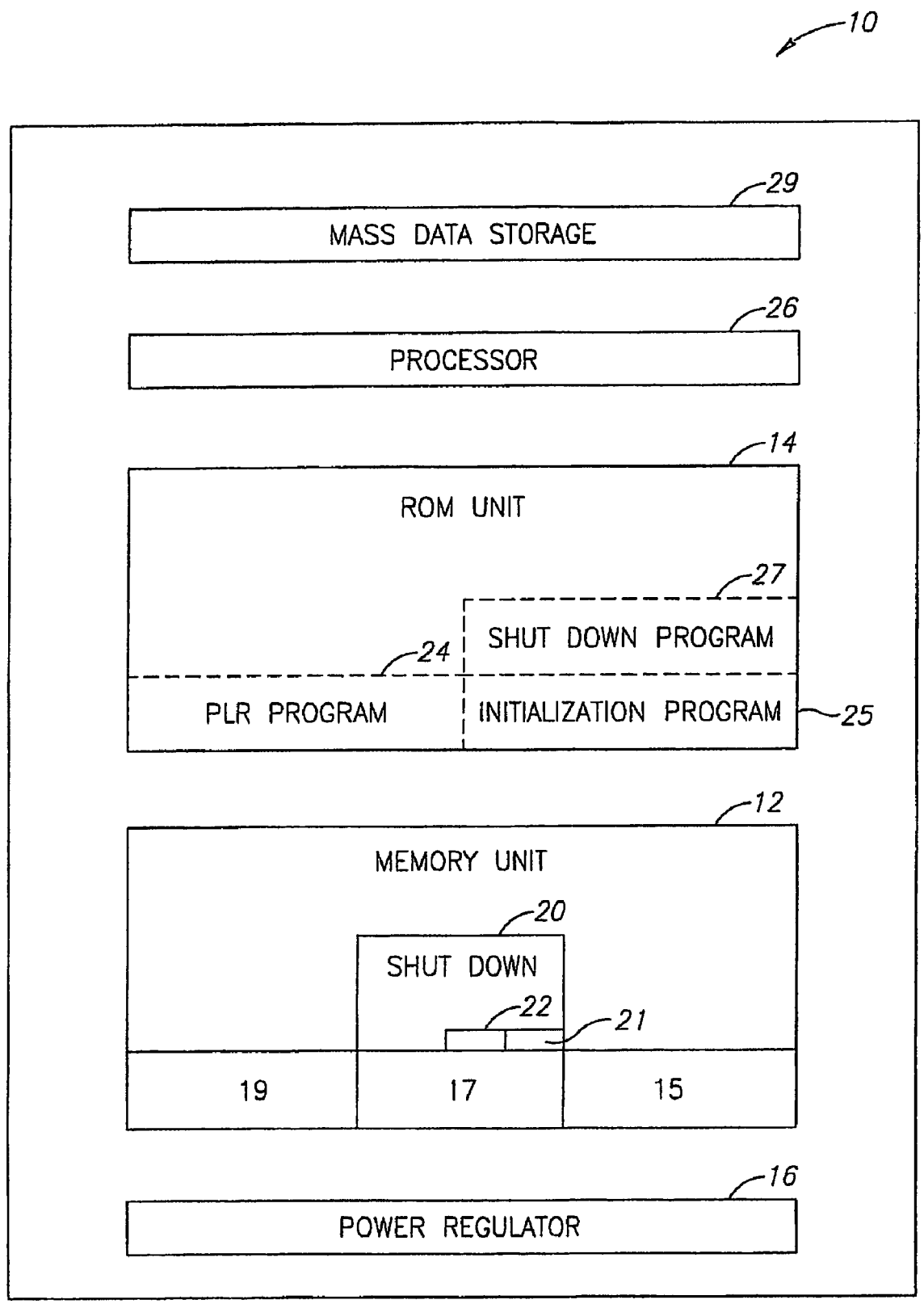
FIG. 1 is a schematic diagram of components of a device including a solid state non-volatile memory unit in accordance with an exemplary embodiment of the invention.

Reference is made to FIG. 1, which is a schematic diagram of components of a device that includes a solid state non-volatile memory unit such as for example a flash memory unit in accordance with an exemplary embodiment of the invention. Device 10 may include one or more memory units such as for example a solid state non-volatile or flash memory unit 12, read only memory (ROM) unit 14 or other memory units such as for example an eraseable electrical programmable read only memory unit (EEPROM) or random access memory (RAM) unit or other mass data storage unit 29. In some embodiments, memory unit 12 may be divided into parts, tables or sub-units such as for example sub-units 15, 17 and 19. In some embodiments, memory unit 12 may be undivided or may be divided into other number of parts, tables or sub units 15. In some embodiments an area or sector of memory unit 12 or of one or more sub-units 15 of memory unit 12 may include a data storage area such as for example a shut down sector 20 that may store for example one or more bits of data as indications of a power up process and a power down process of device 10. In some embodiments, shut down sector 20 may include two or more bits. Shut down sector 20 may be located elsewhere in a device 10. Other numbers of bits may be used. One of such two bits may store an indication 21 that a memory unit 12 or sub-unit 15 was opened or available for writing operations. For example such first bit in indication 21 may be set when device 10 is powered up or turned on. A second bit in shut down sector 20 may store an indication 22 that a shut off or power down of device 10 was made in an orderly manner that did not result from for example an unexpected power loss or crash, or that memory unit 12 or sub-unit 15 was closed in an orderly manner. In some embodiments, ROM unit 14 or another memory unit of device 10 may store a PLR program 24 or other procedure. ROM unit 14 or some other memory unit may also store an initialization program 25 such as for example a procedure that may execute certain functions upon a power up of device 10 or ROM unit 14. ROM unit 14 may also store a shut down program 27 that may execute certain functions as part of an orderly power down of device 10 or memory unit 12. Device 10 may also include a power regulator 16 such as for example a rectifier with one or more filters or capacitors.

Device 10 may include one or more processors such as for example processor 26. Processor 26 may be suitable for example to determine the settings of one or more bits in for example shut down sector 20, or to add or otherwise evaluate or accumulate the values stored in bits of shut down sector 20. For example, processor 26 may determine whether a sum of the values stored in shut down sectors 20 are odd or even.

In operation, an embodiment of the invention may store an indication 21 in a first bit of shut down sector 20 to show that memory unit 12 or for example sub-unit 15 was powered up, opened or otherwise available for a read or write operation. In some embodiments, indication 21 may be stored at the time that device 10 is turned on or powered up. A second bit or other indicator in for example shut down sector 20 may store an indication 22 at or near the end of a power down or shut off procedure of device 10 or of memory unit 12 to indicate that a memory unit 12 or sub-unit 15 was turned off as part of an orderly shut off or power down. In an embodiment of the invention, a processor such as for example processor 26, may evaluate the values stored in one or more shut down sectors 20 to determine whether for example the settings of indications 21 are matched or paired as either even or odd (depending on the convention used) so that 'ON' settings of indications 21 are paired with OFF settings of indications 22. In some embodiments, if there is a match of less than all of the indications 21 with indications 22, processor 26 or another processor may for example issue a signal that a PLR program 24 should be run. If the pairs of indications 21 and indications 22 are not matched, the processor may in some embodiments issue a signal that the PLR program 24 may be bypassed by the initialization program 25. Symbology and coding methods other than ON and OFF may be used. In some embodiments more than one or two bits may be used to express an indication 21 or indication 22.

In some embodiments, indication 21 and indication 22 may be one or more bits having various possible values such as for example 0 and 1. Other data storage units or symbols having other values are possible. In some embodiments, the values in indication 21 and indication 22 may be added or otherwise combined to indicate for example whether their sum is even or odd. For example, indication 21 may be set to 0 when a device 10, memory unit 12 or sub-unit 15 is powered up, opened or otherwise available for reading or writing. Indication 22 may be set to 1 when a device 10, memory unit 12 or sub-unit 15 is closed as part of an orderly power down or shut off. When device 10, memory unit 12 or sub-unit 15 are powered up again, processor 26 may sum or otherwise process the values stored as indication 21 and indication 22 to determine for example if the sum of the values is for example odd or even. For example, if such sum is even, processor 26 may order a PLR program 24 to run at the power-up of device 10. A PLR program 24 may not be ordered if such sum is odd. If the convention of indication 21 and indication 22 were set differently, a PLR program 24 may be ordered if the sum were even. Processes other than a determination of odd or even values may be used, and a determination of a need for a PLR program 24 or other recovery processes may be made at times other than a power up.

In some embodiments, the sum of indication 21 and indication 22 may be odd so long device 10 has been powered up and remains in operation as part of for example its regular use. The sum of indication 21 and indication 22 will go to even for example only upon an orderly shut down.

In some embodiments, device 10 may be or include a telephone, cellular phone, personal digital assistant, video appliance, electronic game console, calculator, personal computer, pager or other suitable device that includes a solid state non-volatile memory unit such as for example a flash memory unit. Other devices and other memory units are possible.

In some embodiments, memory unit 12 may be a suitable solid state non-volatile readable and writeable memory that does not rely on a disc drive for its operation, and that can retain its memory content without a power source. Memory unit 12 may include for example traditional floating gate flash memory, polymer based memory, Ovonics memory, chalcogenides, ferroelectric RAM, magnetic RAM and other suitable solid state non-volatile memories that may retain an on/off state without refreshing from a power source. In some embodiments, memory unit 12 may include more than one memory unit, such as for example a chip of flash memory. Memory unit 12 may in some embodiments be divided or sub-divided by designation of an index or otherwise, into sub-units 15, sectors or areas, such as for example sub-units 17 and 19. Other number of memory units 12 or sub units 15 may be used.

One or more of memory units 12 or sub-units 15 of memory unit 12 may include a sector such as for example designated shut down sector 20. In some embodiments, a shut down sector 20 may be located other than on memory unit 12 such as for example on a hard drive or other non-volatile memory. In some embodiments, shut down sector 20 may be any suitable space on memory unit 12 or elsewhere upon which may be stored two or more bits of information. A physical sector of the memory unit 12 may in some embodiments not be designated.

In some embodiments, PLR program 24 may be one or more instructions suitable to isolate, correct or otherwise compensate for corruptions or incomplete changes that may have been made to data stored in a memory unit 12 as a result of an unplanned or disorderly loss of power to a device or memory unit 12. In some embodiments a PLR program 24 may be executed for example when a device 10 is turned on or powered up to isolate, correct or otherwise compensate for possible corrupted data that may have for example been stored on a memory.

In some embodiments, a part of the power up or initialization procedure of device 10 may be to reset indication 22 to indicate that no orderly power down has yet been performed in the current operating session of device 10. If indication 22 was already set to 0 when device 10 was powered on, no such resetting may be necessary, and such setting may indicate that the prior power-down or shut off was accidental or not orderly.

In some embodiments, a part of the shut down program 27 for device 10 may be to set indication 22 to for example 1 to indicate that the shut down was completed in an orderly and planned fashion, and not as a result of a power loss. For example, the shut down program 27 may check that open data files on memory unit 12 have been closed and that there are no pending operations on such files. In some embodiments indication 22 may be set at the end of or in one of the last phases of the shut down procedure, such as immediately before device 10 is actually powered down.

Figure 2:
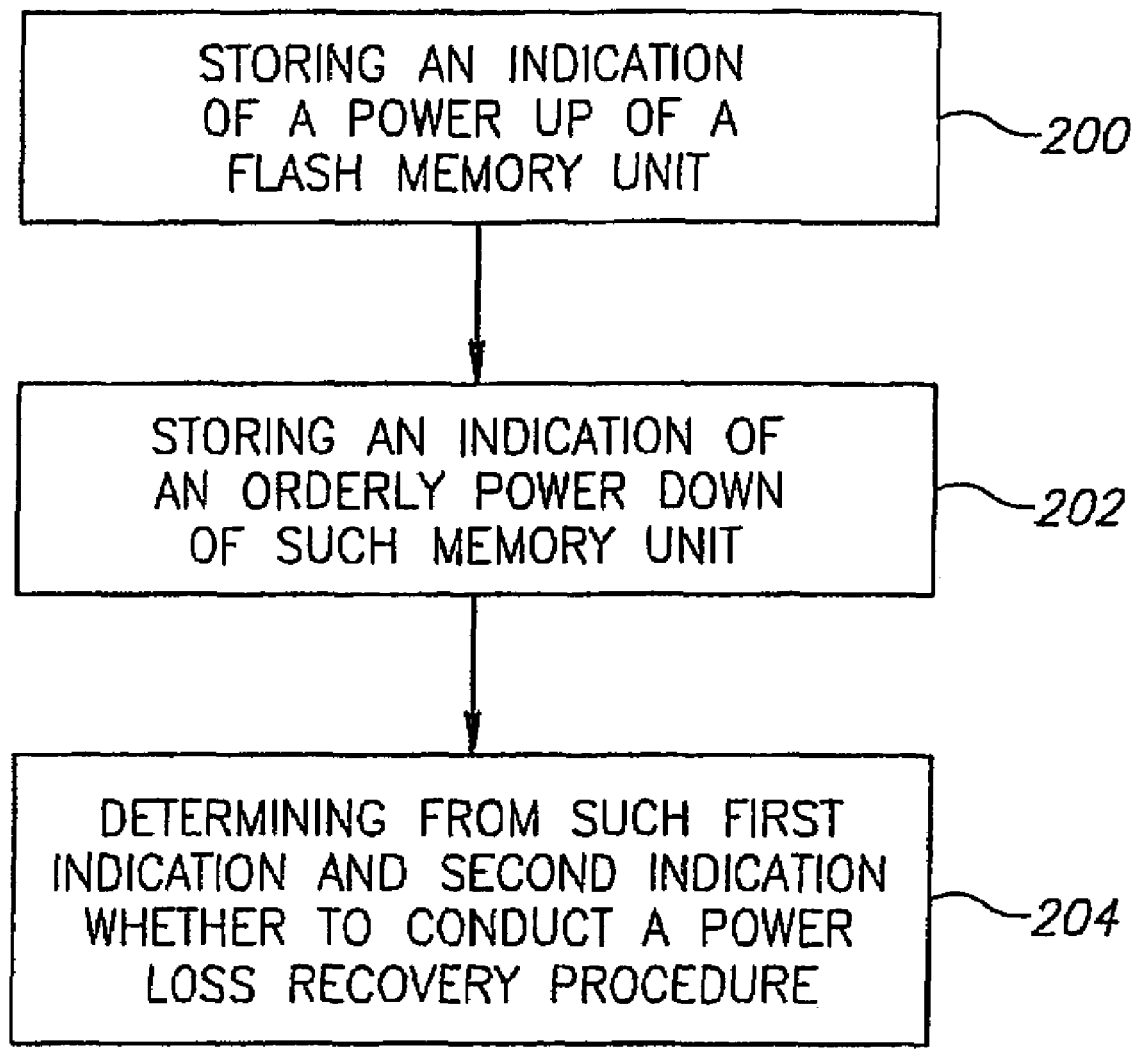
FIG. 2 is a flow diagram depicting a method of determining whether to run power loss recovery procedures on a device with a solid state non-volatile memory unit in accordance with an exemplary embodiment of the invention.

Reference is made to FIG. 2, a flow diagram depicting a method of determining whether to run power loss recovery procedures on a device with a solid state non-volatile memory unit such as a flash memory unit in accordance with an exemplary embodiment of the invention. In block 200, an indication of a power up of a device or of for example a solid state non-volatile memory unit such as a flash memory unit of a device may be stored upon such power up. In some embodiments such indication may be stored in a bit of the solid state non-volatile memory unit that is powered up. In some embodiments, such bit may be included in a designated sector of a memory unit that may be accessed by for example a processor as part of a power up and power down of a device. In some embodiments such bit may be a 1. Other number of bits and other values may be used.

In block 202, an indication of an orderly shut down of a device or of for example a solid state non-volatile memory unit in a device may be stored upon an orderly shut off or power down of a device or of a solid state non-volatile memory unit such as for example a flash memory unit in such device. In some embodiments, such indication may be stored in a bit, and such bit may be included in a designated sector of a memory unit that may be accessed by for example a processor as part of a power up and power down of a device. In some embodiments such bit may be set to 1. Other number of bits and other values or settings may be used.

In block 204, when a device or for example a solid state non-volatile memory unit such as for example a flash memory unit is powered up or turned on, the first indication and the second indication may be evaluated to determine whether to conduct a PLR procedure. In some embodiments, such evaluation may be or include summing the first bit and the second bit to determine whether the sum is odd or even. In some embodiments, the second bit may be re-set after the evaluation is made. In some embodiments, such resetting process may include adding an additional bit or set of bits to for example a shut down sector, and setting one of such bits to bring a sum of values in the sector to a starting point such as odd or even to indicate that the device was powered up. In some embodiments such determination may be made by determining whether the first indication is present and the second indication is absent. In some embodiments such determination may be performed on one or more bits or indicators in one or more solid state non-volatile memory units such as for example flash memory units of for example a device or operably connected to a device.

Figure 3:
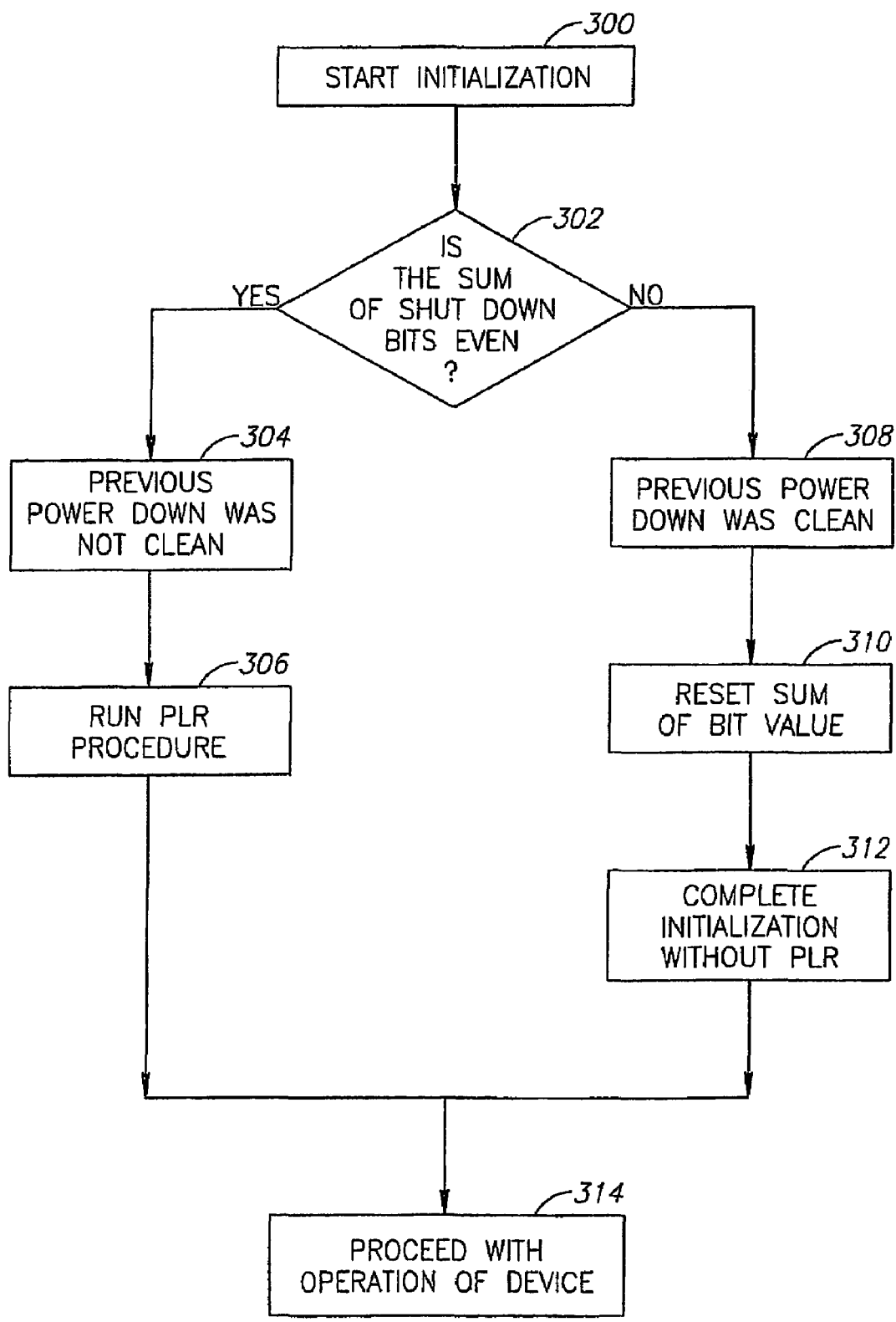
FIG. 3 is a flow chart of a method in accordance with an embodiment of the invention.

Reference is made to FIG. 3, a flow chart of a method in accordance with an embodiment of the invention. In block 300, a device or a solid state non-volatile memory unit such as for example a flash memory unit in a device may be powered up or initialized as part of the process of turning the device or memory unit on. In some embodiments the initialization may occur when the entire device is turned on or when a particular component such as for example a flash memory unit is turned on. In block 302 a determination is made, by for example a processor, as to whether the sum of the bits in a shut down sector of a memory of the device is even or odd. Other processes may be used and other determinations may be made. If the sum of the bits in for example a shut down sector is even, the method continues in block 304. If such sum of the bits is odd, the method may continue to block 308. In block 304, a processor may determine based on for example the sum of the values stored in a shut down sector that the prior shut down of the device or the memory unit was not clean, intentional or orderly and that such shut down may have resulted from an unanticipated loss of power. The method may continue to block 306, where a signal may be transmitted by for example a processor to run a PLR procedure to correct or otherwise compensate for an unplanned loss of power in the prior shut down, and such PLR may be executed or run. After the PLR procedure is run, the method may continue to block 314 where the operation of the device or the memory unit may proceed with normal functioning.

Returning to block 302, if the sum of the bits in the shut down sector is odd, the method may continue to block 308, where a determination may be made by for example a processor that the previous shut down was clean, orderly or not as a result of a power loss. The method may then continue to block 310 where a signal may be transmitted by for example a processor to add another bit or set of bits to for example a shut down sector to restore the sum of the values in such sector to for example even. The method may then proceed to block 312 where the initialization process of the device or the memory unit may be completed without running a PLR process. The method may then proceed to block 314 where the operation of the device or the memory unit proceeds with normal functioning.

Other methods or parts of methods are possible.

It will be appreciated by persons skilled in the art that embodiments of the invention are not limited by what has been particularly shown and described hereinabove. Rather the scope of at least one embodiment of the invention is defined by the claims below.

We claim:

1. A method comprising:
storing a first indication to indicate a power up of a flash memory unit;
storing a second indication to indicate an orderly power down of said flash memory unit; and
determining from said first indication and said second indication whether to conduct a power loss recovery procedure, wherein said determining comprises evaluating a sum of values in said first indication and said second indication.

2. The method as in claim 1, wherein said storing said first indication comprises setting a bit in said flash memory unit.

3. The method as in claim 1, wherein said evaluating comprises determining whether said sum is even.

4. The method as in claim 1, wherein said storing said second indication comprises storing said second indication immediately before an end of an orderly power down of a device comprising said flash memory unit.

5. The method as in claim 1, comprising conducting said power loss recovery procedure in the presence of said first indication and an in the absence of said second indication.

6. The method as in claim 1, comprising resetting said second indication after said determining.

7. A device comprising:
a solid state non-volatile memory unit;
a first bit to store an indication of a power up of said solid state non-volatile memory unit;
a second bit to store an indication of an orderly power down of said solid state non-volatile memory unit;
a processor to determine a setting of said first bit and said second bit; and
a second memory unit to store a power loss recovery program.

8. The device as in claim 7, wherein said processor is to issue a signal to execute said power loss recovery program upon said determining the setting.

9. A device comprising:
a solid state non-volatile memory unit;
a first bit to store an indication of a power up of said solid state non-volatile memory unit;
a second bit to store an indication of an orderly power down of said solid state non-volatile memory unit; and
a processor to determine a setting of said first bit and said second bit and to reset said second bit after determination of the setting.

10. A device comprising:
a solid state non-volatile memory unit;
a first bit to store an indication of a power up of said solid state non-volatile memory unit;
a second bit to store an indication of an orderly power down of said solid state non-volatile memory unit;
a processor to determine a setting of said first bit and said second bit; and
an initialization program to execute said determination upon said power up.

11. A device comprising:
a solid state non-volatile memory unit;
a first bit to store an indication of a power up of said solid state non-volatile memory unit;
a second bit to store an indication of an orderly power down of said solid state non-volatile memory unit; and
a processor to determine a setting of said first bit and said second bit and to evaluate a sum of values in said first bit and said second bit.

12. A system comprising:
a flash memory unit;

a first bit to store an indication of a power up of said flash memory unit;

a second bit to store an indication of an orderly power down of said flash memory unit;

a processor to determine a setting of said first bit and said second bit;

a power regulator; and a second memory unit to store a power loss recovery procedure.

13. The system as in claim 12, wherein said processor is to issue a signal upon determination of the setting, said signal is a signal to run said power loss recovery procedure.

14. An article comprising a machine-accessible storage medium having stored thereon instructions that when executed result in:

storing a first indication to indicate a power up of a flash memory unit;

storing a second indication to indicate an orderly power down of said flash memory unit;

determining from said first indication and said second indication whether to conduct a power loss recovery procedure; and evaluating a sum of values in said first indication and said second indication.

15. The article as in claim 14, wherein said determining comprises evaluating a sum of values in said first indication and said second indication.

16. A method comprising:

executing a shut down procedure of a device, said device having a flash memory unit, said shut down procedure comprising a first storing in said device of a first indication that said shut down procedure was executed;

initializing a device, said initializing comprising:

a second storing in said device of a second indication, said second indication indicating that said device was initialized; and determining whether said first indication and said second indication are present.

17. The method as in claim 16, wherein said first storing comprises setting a first bit in said device; and said second storing comprises setting a second bit in said device.

18. The method as in claim 17, comprising summing a value of said first bit and said second bit.

* * * * *